US012746617B2

(12) United States Patent
Morikazu

(10) Patent No.: US 12,746,617 B2
(45) Date of Patent: Sep. 29, 2026

(54) LASER PROCESSING APPARATUS FOR PERFORMING DESIRED PROCESSING ON A WORKPIECE

(71) Applicant: DISCO CORPORATION, Tokyo (JP)

(72) Inventor: Hiroshi Morikazu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 697 days.

(21) Appl. No.: 18/321,457

(22) Filed: May 22, 2023

(65) Prior Publication Data

US 2023/0398630 A1 Dec. 14, 2023

(30) Foreign Application Priority Data

Jun. 10, 2022 (JP) ................................ 2022-094574

(51) Int. Cl.
*B23K 26/064* (2014.01)
*B23K 26/03* (2006.01)
(Continued)

(52) U.S. Cl.
CPC ........ *B23K 26/0648* (2013.01); *B23K 26/032* (2013.01); *B23K 26/0622* (2015.10);
(Continued)

(58) Field of Classification Search
CPC ............ B23K 26/0853; B23K 26/0876; B23K 26/0648; B23K 26/032; B23K 26/0622; B23K 26/364; B23K 26/53; H10P 54/20
See application file for complete search history.

(56) References Cited

U.S. PATENT DOCUMENTS 6,586,707 B2 * 7/2003 Boyle .................... B23K 26/40 219/121.69
8,518,803 B2 * 8/2013 Morikazu .............. H10P 54/00 257/E21.347
(Continued)

FOREIGN PATENT DOCUMENTS

CN 110385521 B * 3/2021 ......... B23K 26/0626
JP 2000288752 A * 10/2000 .............. H10P 72/10
(Continued)

OTHER PUBLICATIONS

English Translation of JP2012240082A (Year: 2012).*
(Continued)

*Primary Examiner* — Courtney D Heinle
*Assistant Examiner* — Wesley Le Fisher
(74) *Attorney, Agent, or Firm* — Greer, Burns & Crain, Ltd.

(57) ABSTRACT

A controller of a laser processing apparatus includes a processing trajectory storage section, a thickness storage section (TSS), a limit processing depth storage section (LPDSS), a pass number storage section (PNSS), a spot overlap rate storage section, and a selecting section. The controller calculates a processing width by multiplying, by a spot diameter, a value obtained by dividing a thickness stored in the TSS by a limit value stored in the LPDSS, and calculates the number of passes of a pulsed laser beam (LB) to be applied to a section width-wise by multiplying the value obtained by dividing the thickness stored in the TSS by the limit value stored in the LPDSS by the number of passes stored in the PNSS, and multiplying a result by a number of spots determined from the spot diameter of the LB, the overlap rate of the spots, and the processing width.

3 Claims, 4 Drawing Sheets

(51) Int. Cl.

| | |
|---|---|
| ***B23K 26/0622*** | (2014.01) |
| ***B23K 26/08*** | (2014.01) |
| ***B23K 26/364*** | (2014.01) |
| ***B23K 26/50*** | (2014.01) |
| ***H10P 54/20*** | (2026.01) |

(52) U.S. Cl.
CPC ...... *B23K 26/0853* (2013.01); *B23K 26/0876* (2013.01); *B23K 26/364* (2015.10); *B23K 26/50* (2015.10); *H10P 54/20* (2026.01)

(56) References Cited

U.S. PATENT DOCUMENTS

| | | | | | |
|---|---|---|---|---|---|
| 8,735,772 | B2 * | 5/2014 | Chacin | B23K 26/0853<br>438/460 |
| 8,871,540 | B2 * | 10/2014 | Sato | B23K 26/53<br>438/33 |
| 10,818,554 | B2 * | 10/2020 | Ban | B23K 26/0006 |
| 2011/0195537 | A1 * | 8/2011 | Koyanagi | B28D 5/0011<br>438/33 |
| 2016/0129526 | A1 * | 5/2016 | Russ | B23K 26/352<br>264/400 |
| 2024/0269769 | A1 * | 8/2024 | Onose | B23K 26/402 |

FOREIGN PATENT DOCUMENTS

| | | | | |
|---|---|---|---|---|
| JP | 2004512690 A | | 4/2004 | |
| JP | 2012240082 A | * | 12/2012 | B23K 26/0613 |
| JP | 2015085347 A | | 5/2015 | |
| TW | 202205399 A | | 2/2022 | |
| TW | 202206214 A | | 2/2022 | |

OTHER PUBLICATIONS

English Translation of JP2000288752A (Year: 2000).*
English Translation of CN110385521B (Year: 2021).*
Notice of Allowance mailed on Jun. 26, 2026 in related Taiwanese Patent application No. 112121183 (2 pages).
Office Action mailed on May 15, 2026 in related Taiwanese Patent application No. 112121183 (2 pages).

* cited by examiner

LASER PROCESSING APPARATUS FOR PERFORMING DESIRED PROCESSING ON A WORKPIECE

BACKGROUND OF THE INVENTION

Field of the Invention

The present invention relates to a laser processing apparatus that performs desired processing on a workpiece held on a chuck table.

Description of the Related Art

A wafer having a plurality of devices such as integrated circuits (ICs) or large scale integrations (LSIs) formed on a top surface thereof so as to be demarcated by a plurality of intersecting planned dividing lines is divided into individual device chips by a dicing apparatus or a laser processing apparatus. The divided device chips are used in electric apparatuses such as mobile telephones, or personal computers.

The laser processing apparatus roughly includes: a chuck table that holds the wafer; an imaging unit that images the wafer held on the chuck table and detects a region to be processed; a laser beam irradiating unit that irradiates the wafer held on the chuck table with a pulsed laser beam; a processing feed mechanism that processing-feeds the chuck table and the laser beam irradiating unit relative to each other. The laser processing apparatus can process the wafer with high accuracy (see Japanese Patent Laid-Open No. 2015-085347, for example).

SUMMARY OF THE INVENTION

In a case where the laser processing apparatus described in the above Japanese Patent Laid-Open No. 2015-085347 is used to form a groove having a desired depth by irradiating the wafer with the pulsed laser beam of a wavelength absorbable by the wafer, there is a problem in that, even when, for example, the condensing point of the pulsed laser beam is positioned at a planned dividing line, the number of passes in which the pulsed laser beam is to be applied is set, and the pulsed laser beam is applied repeatedly, desired processing cannot be performed due to a constraint of a limit to a processing depth for a spot size.

Accordingly, the present applicant has considered calculating the number of spots to be positioned in the width direction of the planned dividing line and the number of passes in which the pulsed laser beam is to be applied in consideration of a limit value of the processing depth for the spot diameter of the pulsed laser beam and the thickness of the wafer to be divided, inputting processing information necessary for the laser processing apparatus, and forming grooves having a desired depth.

However, a problem is found in that a worker has to perform the calculation described above each time a wafer having a different thickness is to be processed, which is too troublesome. Further, a problem occurs in that proper laser processing is unable to be performed and the wafer is damaged due to an error in the calculation. Such problems are not limited to a case where the planned dividing lines of the wafer having the plurality of devices formed on the top surface thereof so as to be demarcated by the plurality of intersecting planned dividing lines are processed, but can occur also in a case where a plate-shaped object is cut and processed into a desired shape.

It is accordingly an object of the present invention to provide a laser processing apparatus that can solve the problem in that a worker has to calculate the number of spots to be positioned in a width direction and the number of passes in which a pulsed laser beam is to be applied each time a workpiece having a different thickness is to be processed, which is too troublesome, in a case of forming grooves having a desired depth by irradiating a workpiece with the pulsed laser beam.

In accordance with an aspect of the present invention, there is provided a laser processing apparatus including a chuck table having a holding surface defined by an X-axis direction and a Y-axis direction and configured to hold a workpiece, a laser beam irradiating unit configured to irradiate the workpiece held on the chuck table with a pulsed laser beam, and a controller. The laser beam irradiating unit includes a laser oscillator configured to emit the pulsed laser beam, and a condenser configured to condense the pulsed laser beam emitted by the laser oscillator onto the workpiece held on the chuck table. The controller includes a processing trajectory storage section configured to store X-coordinates and Y-coordinates of processing trajectories to be formed on the workpiece held on the chuck table, a thickness storage section configured to store a thickness of the workpiece, a limit processing depth storage section configured to store a spot diameter of the pulsed laser beam and a limit value of a processing depth, a pass number storage section configured to store the number of passes of the pulsed laser beam reaching the limit value of the processing depth, an overlap rate storage section configured to store an overlap rate of spots, a selecting section configured to select a product region and a non-product region, a processing width calculating section configured to calculate a processing width by multiplying, by the spot diameter, a value obtained by dividing the thickness stored in the thickness storage section by the limit value stored in the limit processing depth storage section, and a pass number calculating section configured to calculate the number of passes of the pulsed laser beam to be applied to a section in the processing width by multiplying the value obtained by dividing the thickness stored in the thickness storage section by the limit value stored in the limit processing depth storage section by the number of passes stored in the pass number storage section, and multiplying a result of the multiplication by the number of spots determined from the spot diameter of the pulsed laser beam, the overlap rate of the spots, the overlap rate being stored in the overlap rate storage section, and the processing width calculated by the processing width calculating section. The controller performs control to perform desired processing on the workpiece held on the chuck table by irradiating the processing width calculated by the processing width calculating section in the non-product region selected by the selecting section on a basis of the X-coordinates and the Y-coordinates stored in the processing trajectory storage section with the pulsed laser beam in the number of passes calculated by the pass number calculating section.

Preferably, the laser processing apparatus described above further includes an X-axis feed mechanism configured to processing-feed the chuck table and the laser beam irradiating unit relative to each other in the X-axis direction, and a Y-axis feed mechanism configured to processing-feed the chuck table and the laser beam irradiating unit relative to each other in the Y-axis direction. The controller performs the processing by controlling the laser oscillator and controlling the X-axis feed mechanism and the Y-axis feed mechanism. The laser beam irradiating unit further includes an X-axis optical scanner configured to guide the pulsed laser beam in the X-axis direction, and a Y-axis optical scanner configured to guide the pulsed laser beam in the Y-axis direction. The condenser includes an fθ lens.

According to the laser processing apparatus in accordance with the present invention, the controller computes and calculates the number of spots to be positioned in the width direction of desired processing trajectories and the number of passes in which the pulsed laser beam is to be applied in consideration of the limit value of the processing depth for the spot diameter of the pulsed laser beam and the thickness of the workpiece to be divided. The number of spots to be positioned in the width direction of the desired processing trajectories and the number of passes in which the pulsed laser beam is to be applied are reflected in the laser processing performed by the control of the controller. This obviates a need for a worker to calculate the parameters described above one by one, input the parameters to the laser processing apparatus, and thereby set the parameters so as to form grooves having a desired depth, and solves a problem in that the complex calculation described above needs to be performed each time a workpiece having a different thickness is to be processed, which is too troublesome. In addition, a problem of damaging the workpiece due to an error in the calculation is also solved.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A laser processing apparatus according to an embodiment of the present invention will hereinafter be described in detail with reference to the accompanying drawings.

Figure 1:
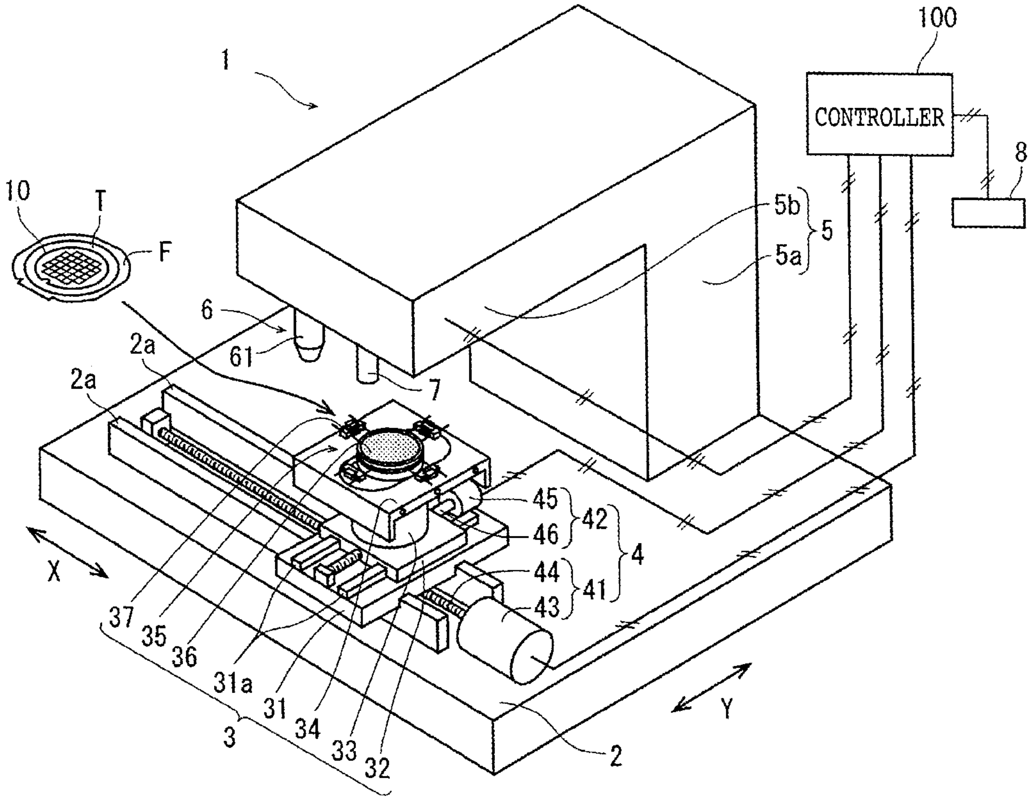
FIG. 1 is a general perspective view of a laser processing apparatus according to an embodiment of the present invention.

FIG. 1 illustrates a general perspective view of a laser processing apparatus 1 according to the present embodiment. The laser processing apparatus 1 includes: a holding unit 3 that is disposed on a base 2 and includes a chuck table 35 that holds a wafer 10 depicted in the figure; a laser beam irradiating unit 6 that irradiates the wafer 10 held on the chuck table 35 with a pulsed laser beam; and a controller 100.

In addition, the laser processing apparatus 1 includes: a moving mechanism 4 including an X-axis feed mechanism 41 that moves the chuck table 35 in an X-axis direction and a Y-axis feed mechanism 42 that moves the chuck table 35 in a Y-axis direction; a frame body 5 including a vertical wall portion 5*a* erected on the base 2 and on a side of the moving mechanism 4 and a horizontal wall portion 5*b* extending in a horizontal direction from an upper end portion of the vertical wall portion 5*a*; and an imaging unit 7 that images the wafer held on the chuck table 35 to perform alignment. An input unit 8 and a display unit not depicted are connected to the controller 100. Incidentally, the display unit can also be used as the input unit 8 when the display unit is configured as a touch panel that allows touch input.

As depicted in FIG. 1, the holding unit 3 includes: a rectangular X-axis direction movable plate 31 mounted on the base 2 so as to be movable in the X-axis direction; a rectangular Y-axis direction movable plate 32 mounted on the X-axis direction movable plate 31 so as to be movable in the Y-axis direction; a cylindrical column 33 fixed to an upper surface of the Y-axis direction movable plate 32; and a rectangular cover plate 34 fixed to an upper end of the column 33. The cover plate 34 is provided with the chuck table 35 that extends upward through an elongated hole formed in the cover plate 34. The chuck table 35 is configured to be rotatable by a rotational driving mechanism not depicted that is housed in the column 33. A holding surface 36 formed of a porous material having air permeability and defined by the X-axis direction and the Y-axis direction is formed on an upper surface of the chuck table 35. The holding surface 36 is connected to suction means not depicted by a flow passage that passes through the column 33. Four clamps 37 that are used to hold the wafer 10 to be described later on the chuck table 35 are arranged at equal intervals on the periphery of the holding surface 36. The wafer 10 can be sucked and held on the holding surface 36 of the chuck table 35 by actuating the suction means.

The X-axis feed mechanism 41 converts rotary motion of a motor 43 into rectilinear motion via a ball screw 44, and transmits the rectilinear motion to the X-axis direction movable plate 31. The X-axis feed mechanism 41 thereby moves the X-axis direction movable plate 31 in the X-axis direction along a pair of guide rails 2*a* and 2*a* arranged along the X-axis direction on the base 2. The Y-axis feed mechanism 42 converts rotary motion of a motor 45 into rectilinear motion via a ball screw 46, and transmits the rectilinear motion to the Y-axis direction movable plate 32. The Y-axis feed mechanism 42 thereby moves the Y-axis direction movable plate 32 in the Y-axis direction along a pair of guide rails 31*a* and 31*a* arranged along the Y-axis direction on the X-axis direction movable plate 31.

An optical system constituting the laser beam irradiating unit 6 described above and the imaging unit 7 are housed inside the horizontal wall portion 5*b* of the frame body 5. A lower surface side of a distal end portion of the horizontal wall portion 5*b* is provided with a condenser 61 that constitutes part of the laser beam irradiating unit 6 and irradiates the wafer 10 with a pulsed laser beam LB. The imaging unit 7 is imaging means for imaging the wafer 10 held on the chuck table 35 and detecting the position and orientation of the wafer 10, a position to be irradiated with the pulsed laser beam, and the like. The imaging unit 7 is disposed at a position adjacent to the condenser 61 described above in the X-axis direction indicated by an arrow X in the figure.

Figure 2:
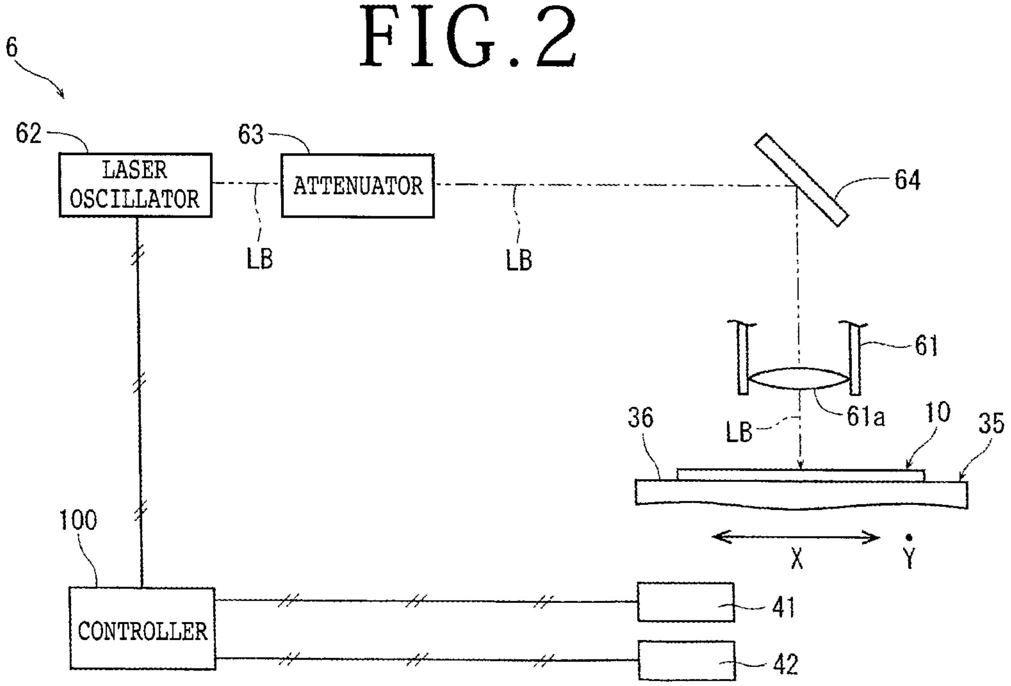
FIG. 2 is a block diagram depicting an optical system of a laser beam irradiating unit disposed in the laser processing apparatus depicted in FIG. 1.

FIG. 2 illustrates a block diagram depicting an example of the optical system of the laser beam irradiating unit 6 described above. The laser beam irradiating unit 6 in the present embodiment includes: a laser oscillator 62 that oscillates the pulsed laser beam LB; an attenuator 63 that adjusts the power of the pulsed laser beam LB oscillated by the laser oscillator 62; a reflecting mirror 64 that changes the optical path of the pulsed laser beam LB to the chuck table 35 side; and the condenser 61 including a condensing lens 61*a* that condenses the pulsed laser beam LB onto the wafer 10 held on the holding surface 36 of the chuck table 35. When the laser beam irradiating unit 6 described above irradiates the wafer 10 as a workpiece with the pulsed laser beam LB, the controller 100 controls the X-axis feed mechanism 41 and the Y-axis feed mechanism 42 described above, and thereby the pulsed laser beam LB can be applied to desired X-coordinate and Y-coordinate positions of the wafer 10 held on the chuck table 35.

Figure 3:
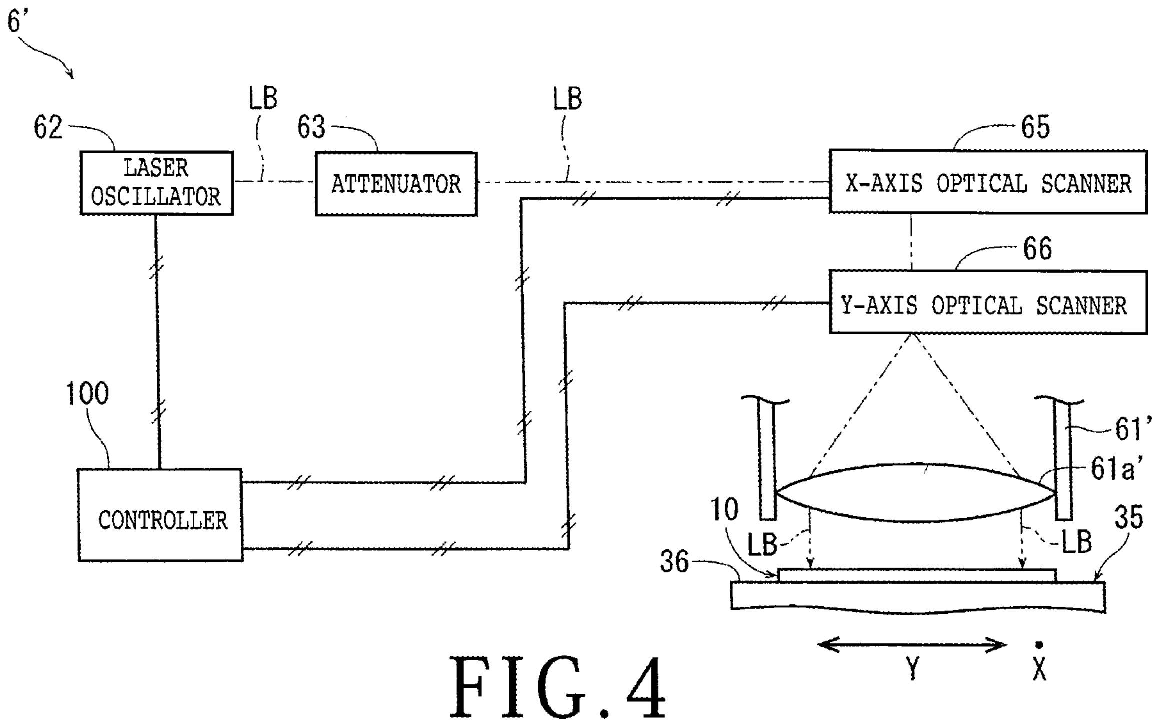
FIG. 3 is a block diagram depicting an optical system in another form of the laser beam irradiating unit disposed in the laser processing apparatus depicted in FIG. 1.

Incidentally, the laser beam irradiating unit according to the present embodiment is not limited to the laser beam irradiating unit 6 depicted in FIG. 2 described above, but may include another form, for example, a laser beam irradiating unit 6' constituted by an optical system as depicted in FIG. 3. The laser beam irradiating unit 6' includes a laser oscillator 62 and an attenuator 63 similar to those described above, and also includes: an X-axis optical scanner 65 that guides the pulsed laser beam LB in the X-axis direction of the wafer 10 held on the holding surface 36 of the chuck table 35; a Y-axis optical scanner 66 that guides the pulsed laser beam LB in the Y-axis direction of the wafer 10 held on the chuck table 35; and a condenser 61' including an fθ lens 61*a'*. The X-axis optical scanner 65 and the Y-axis optical scanner 66 are constituted by a galvanoscanner, for example. When the wafer 10 as a workpiece is irradiated with the pulsed laser beam LB, the controller 100 controls the X-axis optical scanner 65 and the Y-axis optical scanner 66 described above, and thereby the pulsed laser beam LB can be applied at a desired position of the wafer 10 held on the chuck table 35. It is to be noted that the X-axis optical scanner 65 and the Y-axis optical scanner 66 are not limited to the above-described galvanoscanner, but may use an acoustooptic element (AOE), a diffractive optical element (DOE), a polygon mirror, or the like.

Configurations of the wafer 10 as a workpiece of the laser processing apparatus 1 according to the present embodiment and the controller 100 will next be described below. Incidentally, in the embodiment to be described below, description will be made supposing that the laser beam irradiating unit 6 is arranged in the laser processing apparatus 1 depicted in FIG. 2.

Figure 4:
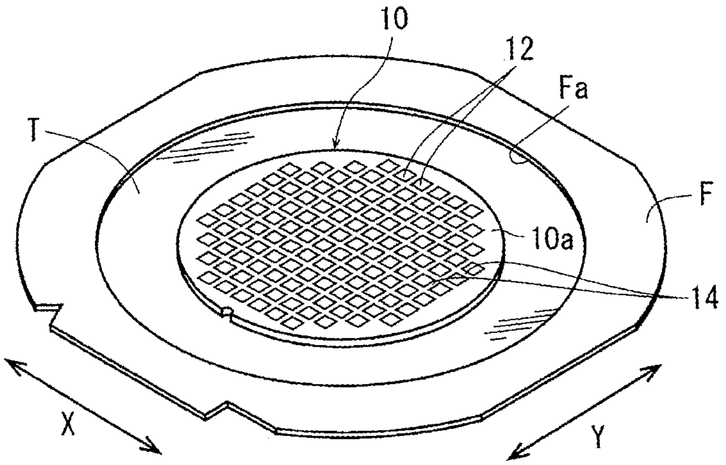
FIG. 4 is a perspective view of a wafer processed by the laser processing apparatus depicted in FIG. 1.

The workpiece to be processed by the laser processing apparatus 1 according to the present embodiment is, for example, a silicon (Si) wafer 10 depicted in FIG. 4. The wafer 10 is a wafer having a plurality of devices 12 formed on a top surface 10*a* so as to be demarcated by a plurality of intersecting planned dividing lines. The wafer 10 is positioned in an opening portion Fa of an annular frame F having the opening portion Fa that can house the wafer 10. The wafer 10 is held in the annular frame F and thereby made integral with the annular frame F via an adhesive tape T.

The controller 100 is constituted by a computer. The controller 100 includes: a central processing unit (CPU) that performs arithmetic processing according to a control program; a read-only memory (ROM) that stores the control program and the like; a readable and writable random access memory (RAM) for temporarily storing an arithmetic result and the like; an input interface; and an output interface. The controller 100 is connected with the imaging unit 7, the input unit 8, the laser oscillator 62, the X-axis feed mechanism 41, the Y-axis feed mechanism 42, and the like.

The laser processing apparatus 1 according to the present embodiment generally has the configuration as described above. Functions and actions of the laser processing apparatus 1 will specifically be described below.

Laser processing of the laser processing apparatus 1 according to the present embodiment on the wafer 10 is performed by the controller 100.

Figure 5:
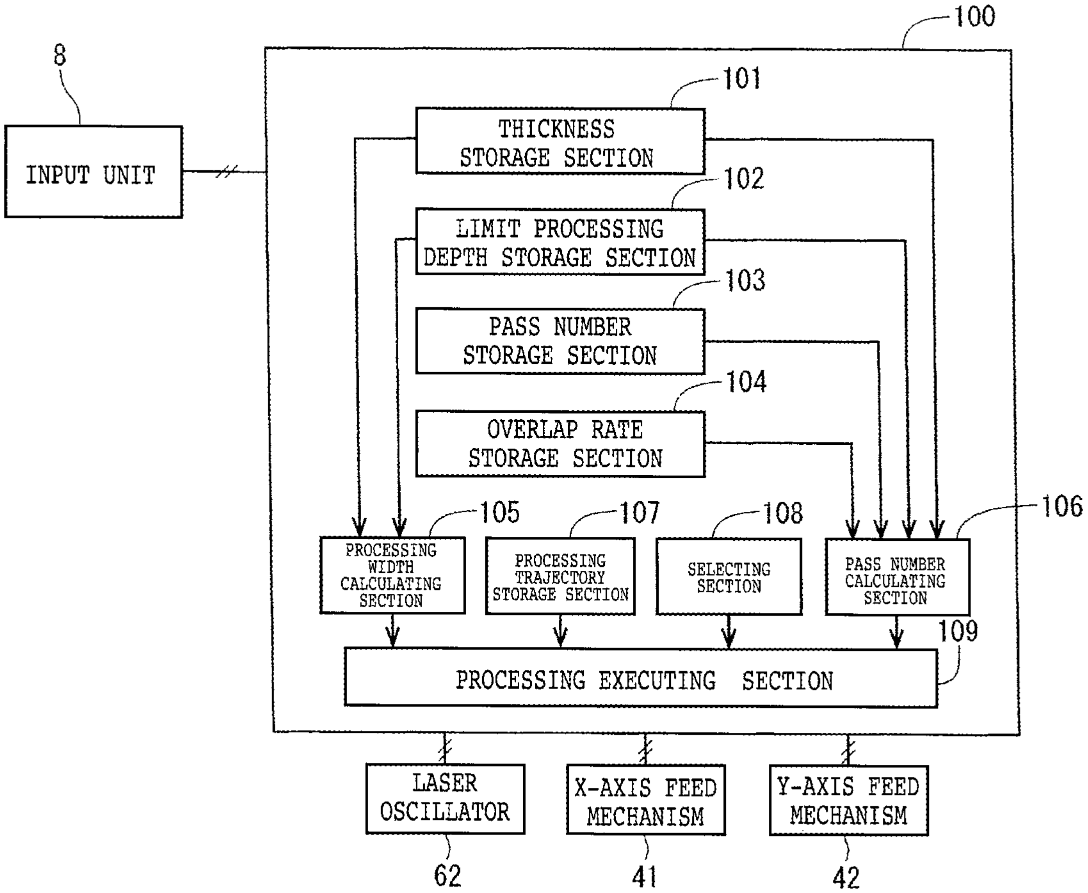
FIG. 5 is a block diagram depicting details of a controller disposed in the laser processing apparatus depicted in FIG. 1.
Figure 6A:
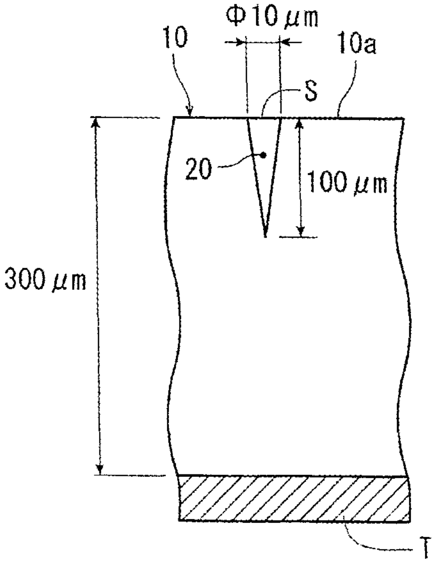
FIG. 6A is a schematic sectional view of a processed groove formed by the laser processing apparatus depicted in FIG. 1.
Figure 6B:
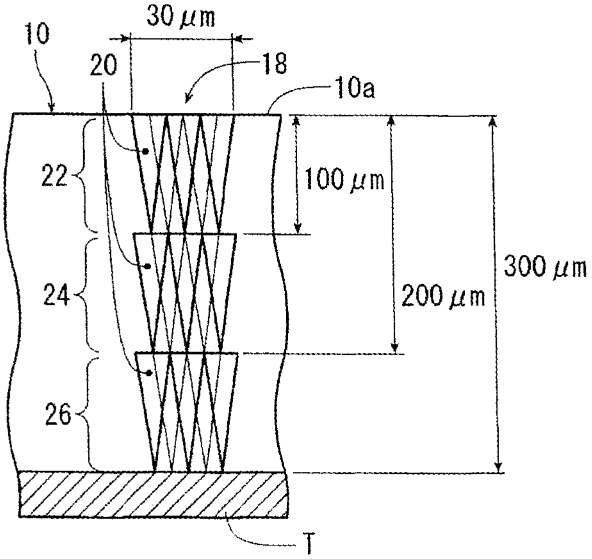
FIG. 6B is a schematic sectional view of a dividing groove formed by the processed groove depicted in FIG. 6A.

Referring to FIGS. 5, 6A, and 6B, description will be made of functional sections 101 to 108 implemented by the control program stored in the controller 100 and the different kinds of storage memories. The controller 100 includes: a thickness storage section 101 that stores a thickness H of the wafer 10 as a workpiece; a limit processing depth storage section 102 that stores a spot diameter S of the pulsed laser beam LB and a limit value R of a processing depth; a pass number storage section 103 that stores the number of passes P of the pulsed laser beam LB reaching the limit value R of the processing depth; and an overlap rate storage section 104 that stores an overlap rate W of spots in question at a time of the laser processing.

The controller 100 further includes: a processing width calculating section 105 that calculates a processing width V by multiplying, by the spot diameter S, a value obtained by dividing the thickness H stored in the thickness storage section 101 by the limit value R stored in the limit processing depth storage section 102; a pass number calculating section 106 that calculates the number of passes Pt of the pulsed laser beam LB to be applied to a section in the processing width V by multiplying the value obtained by dividing the thickness H stored in the thickness storage section 101 by the limit value R of the processing depth which limit value is stored in the limit processing depth storage section 102 by the number of passes P stored in the pass number storage section 103 and multiplying a result of the multiplication by the number of spots St determined from the overlap rate W of the spots which overlap rate is stored in the overlap rate storage section 104 and the processing width V calculated by the processing width calculating section 105. Moreover, the controller 100 includes: a processing trajectory storage section 107 that stores coordinate information I regarding the X-coordinates and the Y-coordinates of processing trajectories to be formed on the wafer 10 held on the chuck table 35; and a selecting section 108 that selects a product region A and a non-product region B. On the basis of information aggregated from the processing width calculating section 105, the pass number calculating section 106, the processing trajectory storage section 107, and the selecting section 108 described above, a processing executing section 109 that performs the laser processing controls the laser oscillator 62, the X-axis feed mechanism 41, and the Y-axis feed mechanism 42 described above to realize the desired laser processing.

Each functional section of the foregoing controller 100 will be described in further detail. The thickness H of the wafer 10 which thickness is to be stored in the thickness storage section 101 is, for example, stored after being obtained through input by a worker operating the input unit 8 or by reading bar code information formed on the wafer 10. The thickness H of the wafer 10 according to the present embodiment is 300 μm, for example. The thickness storage section 101 stores the thickness H=300 μm of the wafer 10.

The limit processing depth storage section 102 stores the limit value R of the processing depth on the basis of the spot diameter S of the pulsed laser beam LB applied by the laser beam irradiating unit 6. This will be described with reference to FIG. 6A. The spot diameter S of the pulsed laser beam LB applied by the laser beam irradiating unit 6 according to the present embodiment is 10 μm, for example. When the pulsed laser beam LB is repeatedly applied along a desired position, a depth of a processed groove 20 formed at the predetermined position is gradually increased. However, the depth is not infinitely increased in proportion to the number of times that the pulsed laser beam LB is applied along the desired processing position (the number of passes P). There is a limit value R of the processing depth beyond which limit value the depth is not further increased. The limit value R of the processing depth on the basis of the spot diameter S=10 μm set under laser processing conditions (to be described later) of the present embodiment is obtained by an experiment performed in advance, and an actually measured value of the limit value R (100 μm in the present embodiment) is stored as the limit value R in the limit processing depth storage section 102 according to the present embodiment.

The pass number storage section 103 stores the number of passes P for reaching the actually measured limit value R of the processing depth in the limit processing depth storage section 102 described above. In the present embodiment, the pass number storage section 103 stores the number of passes P=8 as an actually measured value. In addition, as depicted in FIG. 6B, the overlap rate storage section 104 is means for storing the overlap rate of spots in the X-axis direction and the Y-axis direction at a time of forming a dividing groove 18 by a plurality of processed grooves 20 by applying the pulsed laser beam LB. The overlap rate is set to 50% in each of the X-axis direction and the Y-axis direction in the present embodiment, and is stored in the overlap rate storage section 104.

The processing width calculating section 105 calculates the processing width V necessary to form the dividing groove 18 having such a depth as to completely divide the wafer 10. Specifically, the processing width V is calculated as follows by multiplying, by the spot diameter S (10 μm), a value obtained by dividing the thickness H (300 μm) stored in the thickness storage section 101 by the limit value R (100 μm) stored in the limit processing depth storage section 102.

$$\text{Processing Width } V=(H/R)\cdot S=(300/100)\cdot 10=30\ [\mu m]$$

A processing width V=30 μm is thereby calculated and stored.

The pass number calculating section 106 calculates the number of passes Pt of the pulsed laser beam LB to be applied to a section in the processing width V described above. The number of passes Pt is the number of passes of the pulsed laser beam LB which number of passes is necessary to form the dividing groove 18 that completely divides the wafer 10 along a planned dividing line 14 of the wafer 10. The number of passes Pt is calculated by multiplying a value obtained by dividing the thickness H (300 μm) stored in the thickness storage section 101 by the limit value R (100 μm) stored in the limit processing depth storage section 102 by the number of passes P (eight times) stored in the pass number storage section 103, and multiplying a result of the multiplication by the number of spots St determined from the overlap rate W (50%) of spots which overlap rate is stored in the overlap rate storage section 104 and the processing width V (30 μm) calculated by the processing width calculating section 105.

Here, letting x be the number of pulsed laser beams LB applied so as to be overlapped in a width direction following a first spot, the number of spots St of the pulsed laser beam LB applied in the processing width V is expressed by "St=1+x." From a relational equation (Spot Diameter S)·{1+(100%−Overlap Rate W)·x}=Processing Width V, this x is obtained by solving 10·{1+(1−0.5)·x}=30 with respect to x (x=4). Thus, the number of spots St applied for the processing width V=30 μm is "5" (see also FIG. 6B).

Then, the number of passes Pt of the pulsed laser beam LB to be applied to a section in the processing width V is calculated as follows.

$$Pt=(H/R)\cdot P\cdot St=(300/100)\cdot 8.5=120$$

As is understood by referring to FIG. 6B, the number of passes Pt of the pulsed laser beam LB to be applied to a section in the processing width V in the present embodiment represents the number (Pt=120) as a total of: a number of times (40 times) for first forming a first groove 22 having a width of 30 μm and a depth of 100 μm by applying the number of passes P (eight times) of the pulsed laser beam LB reaching the limit value (100 μm) of the processing depth at each of five spot positions positioned so as to overlap each other by 50% in the processing width direction in the processing width V (30 μm) for performing processing in the wafer 10; a number of times (40 times) for forming a second groove 24 having a width of 30 μm and a depth reaching 200 μm by positioning a condensing point position of the pulsed laser beam LB at a bottom of the first groove 22 and performing laser processing similar to that described above after forming the first groove 22; and a number of times (40 times) for forming a third groove 26 that has a width of 30 μm and a depth of 300 μm, that is, which completely divides the wafer 10, by positioning the condensing point position of the pulsed laser beam LB at a bottom of the second groove 24 and performing laser processing similar to that described above after forming the first groove 22 and the second groove 24. The dividing groove 18 that completely divides the wafer 10 can be formed by forming the first groove 22, the second groove 24, and the third groove 26 as described above.

Figure 7:
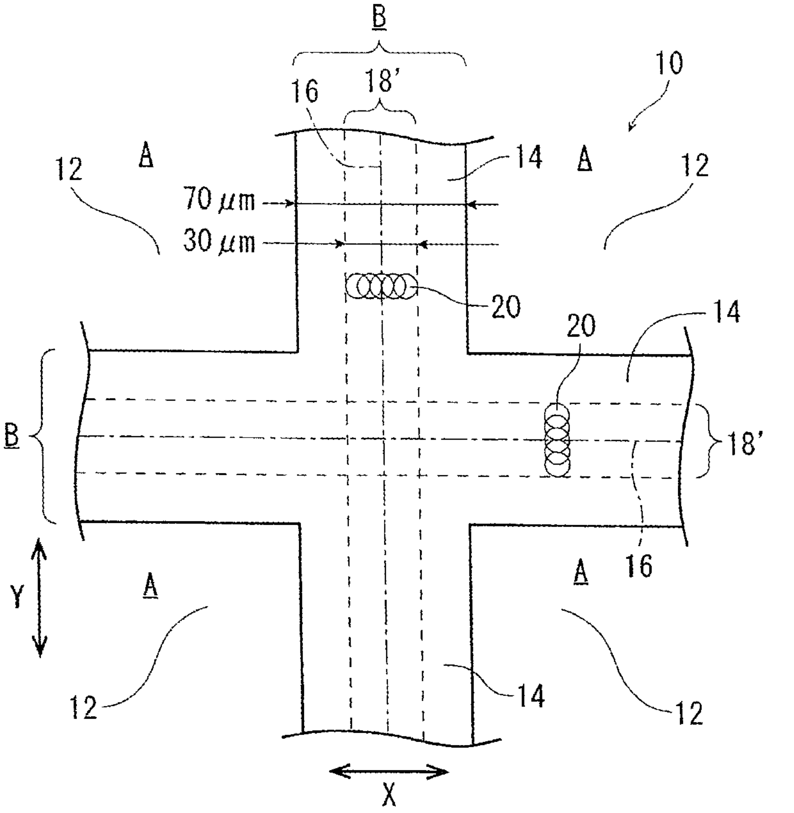
FIG. 7 is a plan view depicting, on an enlarged scale, a part of the wafer depicted in FIG. 4.

As described above, the controller 100 includes the processing trajectory storage section 107 that stores the coordinate information I regarding the X-coordinates and the Y-coordinates of processing trajectories to be formed in the wafer 10 held on the chuck table 35. The coordinate information I stored in the present embodiment, that is, the coordinate information I regarding the X-coordinates and the Y-coordinates identifying central lines 16 along planned dividing lines 14 of the wafer 10 depicted on an enlarged scale in FIG. 7 indicates the processing trajectories. The coordinate information I regarding the X-coordinates and the Y-coordinates of the central lines 16 is registered by the above-described input unit 8 and stored in the processing trajectory storage section 107 in advance.

Further, the controller 100 includes the selecting section 108 that selects a product region A and a non-product region B, as described above. The product region A in the present embodiment means a region that includes a device 12 described above or the device 12 and outer edges thereof and in which laser processing is not allowed. The non-product region B means a region in which the above-described laser processing is allowed. That is, making description with reference to FIG. 7, a region in which a device 12 is arranged in the wafer 10 is selected as a product region A, and a region in which a planned dividing line 14 is formed is selected as a non-product regions B. The product region A and the non-product regions B are stored in the selecting section 108. The dividing groove 18 resulting from the laser processing described above is formed in a planned processing region 18' indicated by a broken line along a central line 16 indicated by alternate long and short dashed lines in the non-product region B (planned dividing line 14). On the basis of the information stored in the selecting section 108, the laser processing is prevented from accidentally reaching the product region A. Incidentally, in actuality, the selecting section 108 may select only either the product region A or the non-product region B, and the present embodiment may be carried out supposing that the remaining region is the other region (the product region A or the non-product region B). In addition, the width of the planned dividing line 14 selected as the non-product region B in the present embodiment is 70 μm, as depicted in the figure. If the processing width V calculated in the processing width calculating section 105 described above is a value exceeding 70 μm, it is determined that processing is not possible because proper laser processing cannot be performed in the non-product region B (planned dividing line 14) even when the dividing groove 18 described above is intended to be formed along the central line 16 of the planned dividing line 14. In this case, the following laser processing conditions are adjusted.

After the controller 100 obtains the processing width V, the number of passes Pt of the pulsed laser beam LB to be applied to a section in the processing width V, and the coordinate information I regarding the X-coordinates and the Y-coordinates of processing trajectories to be formed and the product region A and the non-product region B are selected, as described above, laser processing on the wafer 10 is performed on the basis of the processing executing section 109 of the controller 100.

Incidentally, the laser processing conditions in the present embodiment are set as follows, for example.

Wavelength: 355 nm
Repetition Frequency: 50 kHz
Average Power: 2 W
Pulse Energy: 40 μJ
Pulse Width: 10 ps
Spot Diameter: 10 μm The wafer 10 transported to the laser processing apparatus 1 described with reference to FIG. 1 is mounted on and sucked by the holding surface 36 of the chuck table 35 of the holding unit 3 with the top surface **10*a* side directed upward. The annular frame F is held and fixed by the clamps 37. The wafer 10 held on the chuck table 35 is imaged by use of the imaging unit 7 disposed in the laser processing apparatus 1. An alignment is performed which detects the X-coordinates and the Y-coordinates of processing trajectories in which processing is to be performed, the X-coordinates and the Y-coordinates being stored in the processing trajectory storage section 107. The positions of the planned dividing lines 14 on the top surface 10*a* of the wafer 10 are detected, and a predetermined planned dividing line 14 is aligned with the X-axis direction by rotating the wafer 10** by the rotational driving mechanism.

On the basis of information detected by the alignment described above, as depicted in FIG. 8, the condenser 61 of the laser beam irradiating unit 6 is positioned at a predetermined processing start position in the planned processing region 18' (see also FIG. 7) for forming the dividing groove 18 on the planned dividing line 14 in a first direction, and the condensing point of the pulsed laser beam LB is positioned at the top surface **10*a*. The X-axis feed mechanism 41 and the Y-axis feed mechanism 42 described above are actuated to perform the above-described ablation processing along the planned processing region 18' on the planned dividing line 14 extending in the first direction of the wafer 10 by processing-feeding the wafer 10 in the X-axis direction, and processing-feed the wafer 10 in the Y-axis direction according to the overlap rate W (50% in the present embodiment). The laser processing based on the laser processing conditions described above is performed according to the number of spots St (five in the present embodiment) in the processing width V of the planned processing region 18'. Then, the laser processing described above is repeatedly performed so as to apply the number of passes P described above (eight times in the present embodiment) so as to correspond to one spot by actuating the laser beam irradiating unit 6, the X-axis feed mechanism 41, and the Y-axis feed mechanism 42. Consequently, a recessed groove having a width of 30 μm and a depth of 100 μm (first groove 22 in FIG. 6B) is formed along the planned dividing line 14**. Incidentally, it is possible to optionally determine in what order the pulsed laser beam LB of the number of passes P reaching the limit value R of the processing depth is to be applied so as to correspond to each of the five spots in the present embodiment.

Figure 8:
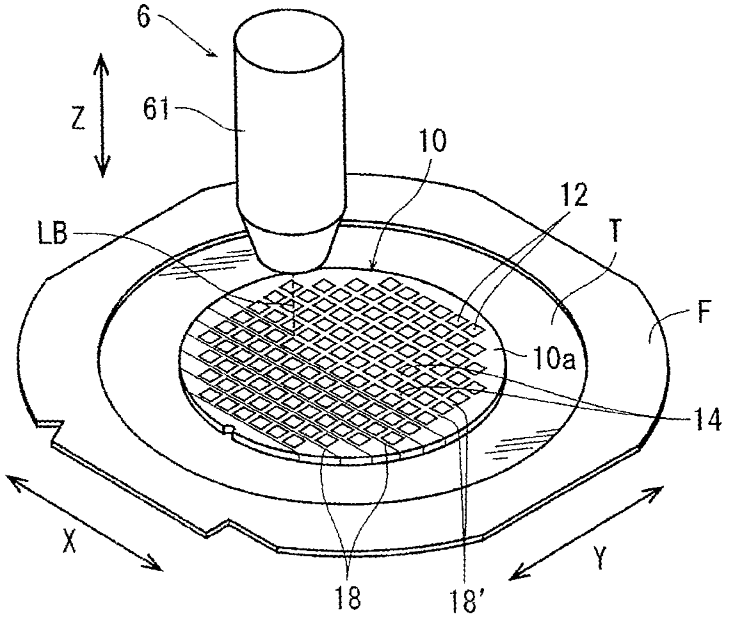
FIG. 8 is a perspective view depicting a mode of laser processing performed by the laser processing apparatus according to the present embodiment.

Next, while a spot is positioned at the bottom of the recessed groove by lowering the position of the condensing point in a Z-axis direction indicated by an arrow Z in FIG. 8, laser processing similar to that described above is performed along the above-described recessed groove. The laser processing for forming the second groove 24 and the third groove 26 described above is thus performed. Consequently, a dividing groove 18 having a depth of 300 μm is formed along the planned processing region 18' of the predetermined planned dividing line 14 by applying the pulsed laser beam LB of a total number of passes Pt=120. After the dividing groove 18 is thus formed along the predetermined planned dividing line 14 extending in the first direction, the wafer 10 is indexing-fed by a distance to a planned dividing line 14 adjacent in the Y-axis direction, and the unprocessed planned dividing line 14 is positioned directly below the condenser 61. Then, a dividing groove 18 is formed by positioning the condensing point of the pulsed laser beam LB in the planned processing region 18' of the planned dividing line 14 of the wafer 10 and applying the pulsed laser beam LB in a similar manner to that described above. Dividing grooves 18 are formed along all of the planned dividing lines 14 extending in the first direction by similarly processing-feeding the wafer 10 in the X-axis direction and indexing-feeding the wafer 10 in the Y-axis direction. Next, the wafer 10 is rotated by 90 degrees, and unprocessed planned dividing lines 14 in a direction orthogonal to the planned dividing lines 14 in the first direction in which the dividing grooves 18 are already formed are aligned with the X-axis direction. Then, dividing grooves 18 are formed along all of the planned dividing lines 14 formed on the top surface **10*a* of the wafer 10 by also positioning the condensing point of the pulsed laser beam LB at all of the remaining planned dividing lines 14 and irradiating the remaining planned dividing lines 14** with the pulsed laser beam LB in a similar manner to that described above.

According to the embodiment described above, the controller 100 calculates the number of spots St to be positioned in the width direction of the planned dividing line 14 and the number of passes Pt in which the pulsed laser beam LB is to be applied in consideration of the limit value R of the processing depth for the spot diameter S of the pulsed laser beam LB and the thickness H of the wafer 10 to be divided. The number of spots St and the number of passes Pt are reflected in the laser processing performed by the controller 100. This obviates a need for the worker to calculate the parameters described earlier one by one, input the parameters to the laser processing apparatus 1, and thereby set the parameters so as to form dividing grooves 18 having a desired depth, and solves a problem in that the worker has to perform the complex calculation described above each time another wafer having a different thickness is to be processed, which is too troublesome. In addition, a problem of damaging the wafer due to an error in the calculation is also solved.

In the embodiment described above, description has been made of an example in which the laser processing apparatus 1 forms grooves having a desired depth by processing the wafer 10 having the plurality of devices 12 formed on the top surface 10*a* so as to be demarcated by the plurality of intersecting planned dividing lines 14. However, the present invention is not limited to this. For example, in a case where a silicon plate having a circular shape is to be processed as a workpiece and a product having a desired shape, for example, a silicon plate having a quadrangular shape identified by the X-coordinates and the Y-coordinates of processing trajectories to be formed, the X-coordinates and the Y-coordinates being stored in the processing trajectory storage section 107, is to be obtained from the silicon plate having the circular shape, the silicon plate having the desired quadrangular shape can be obtained as a product by selecting a region having the desired quadrangular shape as a product region A in the selecting section 108 described above, selecting a region surrounding the product region A as a non-product region B in the selecting section 108 described above, performing the laser processing described above on the non-product region B along the outer edges of the product region A, and thereby forming dividing grooves 18.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus comprising:
- a chuck table having a holding surface defined by an X-axis direction and a Y-axis direction and configured to hold a workpiece;
- a laser beam irradiating unit configured to irradiate the workpiece held on the chuck table with a pulsed laser beam; and
- a controller,
- the laser beam irradiating unit including
  - a laser oscillator configured to emit the pulsed laser beam, and
  - a condenser configured to condense the pulsed laser beam emitted by the laser oscillator onto the workpiece held on the chuck table,
- the controller including
  - a processing trajectory storage section configured to store X-coordinates and Y-coordinates of processing trajectories to be formed on the workpiece held on the chuck table,
  - a thickness storage section configured to store a thickness of the workpiece,
  - a limit processing depth storage section configured to store a spot diameter of the pulsed laser beam and a limit value of a processing depth,
  - a pass number storage section configured to store a predetermined number of passes of the pulsed laser beam reaching the limit value of the processing depth,
  - an overlap rate storage section configured to store an overlap rate of spots,
  - a selecting section configured to select a product region and a non-product region,
  - a processing width calculating section configured to calculate a processing width by multiplying, by the spot diameter, a value obtained by dividing the thickness stored in the thickness storage section by the limit value stored in the limit processing depth storage section, and
  - a pass number calculating section configured to calculate a calculated number of passes of the pulsed laser beam to be applied to a section in the processing width by multiplying the value obtained by dividing the thickness stored in the thickness storage section by the limit value stored in the limit processing depth storage section by the predetermined number of passes stored in the pass number storage section, and multiplying a result of the multiplication by a calculated number of spots determined from the spot diameter of the pulsed laser beam, the overlap rate of the spots, the overlap rate being stored in the overlap rate storage section, and the processing width calculated by the processing width calculating section, and
- wherein the controller is configured to perform desired processing on the workpiece held on the chuck table by irradiating the processing width calculated by the processing width calculating section in the non-product region selected by the selecting section on a basis of the X-coordinates and the Y-coordinates stored in the processing trajectory storage section with the pulsed laser beam in the calculated number of passes calculated by the pass number calculating section.

2. The laser processing apparatus according to claim 1, further comprising:
- an X-axis feed mechanism configured to processing-feed the chuck table and the laser beam irradiating unit relative to each other in the X-axis direction; and
- a Y-axis feed mechanism configured to processing-feed the chuck table and the laser beam irradiating unit relative to each other in the Y-axis direction,
- wherein the controller performs the processing by controlling the laser oscillator and controlling the X-axis feed mechanism and the Y-axis feed mechanism.

3. The laser processing apparatus according to claim 1, wherein
- the laser beam irradiating unit further includes an X-axis optical scanner configured to guide the pulsed laser beam in the X-axis direction, and a Y-axis optical scanner configured to guide the pulsed laser beam in the Y-axis direction,
- the condenser includes an fθ lens, and
- the controller performs the processing by controlling the laser oscillator and controlling the X-axis optical scanner and the Y-axis optical scanner.

* * * * *